US008930151B2

(12) United States Patent
Nistler (10) Patent No.: US 8,930,151 B2
(45) Date of Patent: Jan. 6, 2015

(54) METHOD AND DEVICE TO MONITOR A MODULE OPERATING IN A MAGNETIC RESONANCE SYSTEM

(75) Inventor: Juergen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 239 days.

(21) Appl. No.: 13/111,128

(22) Filed: May 19, 2011

(65) Prior Publication Data

US 2011/0295531 A1 Dec. 1, 2011

(30) Foreign Application Priority Data

May 28, 2010 (DE) .......................... 10 2010 029 463

(51) Int. Cl.
*G06F 19/00* (2011.01)
*G01R 33/36* (2006.01)
*G01R 33/28* (2006.01)

(52) U.S. Cl.
CPC .............. *G01R 33/36* (2013.01); *G01R 33/288* (2013.01)
USPC ........................................................ 702/60

(58) Field of Classification Search
CPC ........ G01R 33/32; G01R 33/36; G06F 19/00; A61B 5/055; G06G 19/00
USPC .................. 324/30, 108, 328, 335, 364, 429, 324/300–322; 702/60, 64, 75, 106, 177, 702/188
See application file for complete search history.

(56) References Cited

U.S. PATENT DOCUMENTS

| | | | | |
|---|---|---|---|---|
| 6,496,006 | B1 * | 12/2002 | Vrijheid ........................ | 324/318 |
| 6,624,629 | B1 * | 9/2003 | Speier et al. .................. | 324/303 |
| 6,759,847 | B2 * | 7/2004 | Brinker et al. ................ | 324/309 |
| 7,340,225 | B2 | 3/2008 | Bielmeier et al. | |
| 7,622,921 | B2 | 11/2009 | Fontius et al. | |
| 7,834,626 | B2 * | 11/2010 | Renz .............................. | 324/318 |
| 2007/0255128 | A1 * | 11/2007 | Nistler .......................... | 600/410 |
| 2008/0231274 | A1 * | 9/2008 | Fontius et al. ................ | 324/309 |
| 2009/0079428 | A1 * | 3/2009 | Nistler et al. ................. | 324/311 |
| 2010/0033180 | A1 * | 2/2010 | Biber et al. ................... | 324/309 |
| 2010/0066361 | A1 * | 3/2010 | Setsompop et al. .......... | 324/309 |
| 2010/0201360 | A1 * | 8/2010 | Morita .......................... | 324/309 |
| 2010/0312091 | A1 * | 12/2010 | Krueger et al. ............... | 600/410 |

* cited by examiner

*Primary Examiner* — Sujoy Kundu
*Assistant Examiner* — Corey Bailey
(74) *Attorney, Agent, or Firm* — Steven H. Noll (57) ABSTRACT

A monitoring method to monitor and/or protect modules, in particular a radio-frequency antenna of a magnetic resonance system, includes a measurement step in which at least one first characteristic monitoring variable is measured by at least one first measurement unit, and at least one calculation step in which at least one maximum limit value for a power and/or a voltage within the module is calculated using the at least one first measured characteristic monitoring variable. At least one second characteristic monitoring variable, different than the at least one first characteristic monitoring variable, is measured in the measurement step.

17 Claims, 3 Drawing Sheets

METHOD AND DEVICE TO MONITOR A MODULE OPERATING IN A MAGNETIC RESONANCE SYSTEM

BACKGROUND OF THE INVENTION

1. Field of the Invention

The present invention concerns a monitoring method to monitor and/or protect modules, in particular a radio-frequency antenna of a magnetic resonance system, of the type wherein: a measurement step is implemented in which at least one first characteristic monitoring variable is measured by means of at least one first measurement unit; and at least one calculation step is implemented in which at least one maximum limit value for a power and/or a voltage within the module is calculated by means of the at least one first measured characteristic monitoring variable.

The present invention also concerns a monitoring device that implements such a method, and a magnetic resonance apparatus that includes such a monitoring device.

2. Description of the Prior Art

In magnetic resonance systems, due to the increasing utilization of existing, design-dependent limits and/or limit values of individual modules, it is necessary to provide monitoring to comply with the existing limits and/or limit values for the individual modules. Endangerment and/or destruction of the individual modules—in particular of a radio-frequency antenna of the magnetic resonance systems—can be reduced or prevented by this monitoring.

It is reasonable to monitor both occurring peak voltages and an average power of the radio-frequency antenna. For example, in the operation of the radio-frequency antenna peak voltages that are too high can lead to arcing and to the destruction of capacitors of the radio-frequency antenna in particular. For example, an average power that is too high can lead to a heating of individual modules of the radio-frequency antenna and therefore can contribute to an increased wear of the individual modules. In addition, due to its immediate proximity to a patient during a magnetic resonance measurement, the radio-frequency antenna and/or individual components of the radio-frequency antenna must comply with predetermined temperature limit values during a measurement operation in order to avoid endangering the patient.

In order to comply with existing limit values, it has been proposed to design the radio-frequency antenna and/or individual components and/or modules of the radio-frequency antenna so as to be markedly overdimensioned. In magnetic resonance systems fashioned in such a manner, the maximum average transmission power and/or the maximum peak power fall markedly below the limit values to be complied with.

It is also known to determine a reference voltage for a patient in order to protect the radio-frequency antenna. For the reference voltage, a magnetic resonance-active magnetic field of 11.75 µT is normally generated and the voltage associated therewith is measured. An allowable maximum transmission voltage is subsequently determined by means of the measured reference voltage, by multiplying the measured reference voltage with a pre-established scaling factor. However, this method has the disadvantage that, for example, a wiring error can lead to a radio-frequency magnetic field that—in comparison with a radio-frequency magnetic field with a correct wiring of the radio-frequency antenna—points in an opposite direction, so due to the wiring error a markedly higher transmission power is generated and/or a markedly higher voltage is present within the radio-frequency antenna than with a correct wiring. The measurement of the reference voltage takes place at measurement points arranged at a distance from the radio-frequency antenna so even though a markedly higher voltage can be present at the radio-frequency antenna, such a higher voltage is not detected by the measurement.

In addition to this, a load (for example a patient) and/or a phantom must always be located within the radio-frequency antenna for the reference measurement. Since the calculated allowable maximum transmission voltage is directly proportional to the measured reference voltage, the allowable maximum transmission voltage is thus subject to the same error sources that can occur for the measured reference voltage. An additional disadvantage of these methods is that an appropriate component protection—in particular the radio-frequency antenna of the magnetic resonance system—is only effective after the determination of the reference voltage, and thus the limit values for a maximum transmission power and/or an average maximum transmission power can already be exceeded in the determination of the reference voltage.

SUMMARY OF THE INVENTION

An object of the present invention is to provide a monitoring method to monitor and/or protect modules, in which actually occurring voltages and/or powers present at the modules are actually detected.

The invention proceeds from a monitoring method to monitor and/or protect modules (in particular a radio-frequency antenna of a magnetic resonance system), of the type that includes: a measurement step in which at least one first characteristic monitoring variable is measured by means of at least one first measurement unit; and at least one calculation step in which at least one maximum limit value for a power and/or a voltage within the computer is calculated by means of the at least one first measured characteristic monitoring variable.

In accordance with the invention, at least one second characteristic monitoring variable different than a first characteristic monitoring variable is measured in the measurement step. A "characteristic monitoring variable" as used herein means a characteristic value for a power and/or an amperage, and/or particularly advantageously is a characteristic value for a voltage. The second characteristic monitoring variable—which is different than the first characteristic monitoring variable—can differ from the first characteristic monitoring variable with regard to the signal type of the signal that is to be detected and/or a signal property of the signal to be detected and/or additional criteria that appear to be reasonable to those skilled in the art. For example, the first characteristic monitoring variable can be formed by a signal amplitude and the second characteristic monitoring variable can be formed by a phase difference between two signals. Furthermore, a "maximum limit value" for a power and/or a voltage is a value that is formed by a maximum allowable power and/or voltage applied in the module, with damage to the module being prevented if the power generated in the module and/or the voltage applied in the module stays below the maximum limit value. The maximum limit value can be formed by a maximum average power and/or maximum peak voltage. The radio-frequency antenna is provided within the magnetic resonance system to create and/or generate a radio-frequency field by means of which a magnetization can be deflected out of its steady state and an excitation of a polarization for a magnetic resonance measurement can take place. The measurement step and/or the at least one calculation step are controlled by means of a control unit of the magnetic resonance system. For this purpose, the control unit can have a processor and additional modules and/or units, for example a memory unit and/or control program units, etc.

The power values that actually occur can advantageously be detected in an embodiment according to the invention wherein these values can be determined using the measured characteristic monitoring variable while including a realistic power distribution within the module. For example, if a patient is located within the radio-frequency antenna the realistic power distribution is advantageously fashioned to be elliptical during a measurement procedure. Furthermore, in the case of a wiring error of the module (in particular of the radio-frequency coil) a correct maximum limit value for a power and/or a voltage can always be maintained because a change of a voltage value and/or power value due to the wiring error can be recognized and/or detected by the measurement of two different characteristic monitoring variables. An adoption and/or calculation of a characteristic power value that is markedly lower than a current power value and/or voltage value that is actually present (as occurs with a wiring error given a conventional monitoring method) thus can be suppressed, and an effective protection or the module (in particular the radio-frequency coil) can be achieved.

Furthermore, the at least one first characteristic monitoring variable can represent a characteristic value of a signal traveling to the module and the at least one second characteristic monitoring variable detects a characteristic value of a signal traveling back from the module. The individual characteristic monitoring variables can be measured by means of a directional coupler and/or at outputs of a directional coupler. A conventional radio-frequency antenna typically has voltage supply lines with a respective directional coupler implemented in each voltage supply line, such that the signal traveling toward the module to be monitored and the signal traveling back from the module to be monitored can be measured particularly simply and while saving on modules. The characteristic monitoring variables—in particular the voltages applied to the module—can be particularly advantageously measured as complex values, for example by detecting an amplitude and a phase of the signal.

In the measurement step, the first characteristic monitoring variable and/or the second characteristic monitoring variable can be respectively measured at least two different measurement locations. Measurement at two different measurement locations means that the characteristic monitoring variables are measured at two different supply lines (in particular voltage supply lines) to the module. Each of the at least two supply lines has a directional coupler at which both the first characteristic monitoring variable and the second characteristic monitoring variable can be measured and/or detected. Voltage and/or power can be measured at two different locations, and using these measurement values a realistic voltage distribution within the module can be determined.

The measurement step preferably takes place before the start of a magnetic resonance measurement (data acquisition), such that during the magnetic resonance measurement a complete protection of the modules is achieved an the magnetic resonance measurement can thus be reliably implemented. The measurement effort for the measurement step is small, such that the duration of the magnetic resonance measurement remains essentially the same due to the monitoring method upstream of the measurement operation, in particular the measurement step of the monitoring method.

Furthermore, in the measurement step a measurement can be conducted with an arbitrary voltage applied to the module, so the measurement step can be implemented with a particularly low voltage and thus a danger of damage to the component in the measurement step (due to an applied voltage that is too high) can be prevented. In the measurement step the measurement is conducted with a load within the module, in particular the radio-frequency antenna with which a magnetic resonance measurement should subsequently take place. In this context a load means an examination subject arranged within the radio-frequency coil unit. The subject of the examination can be a patient and/or a phantom subject simulating a patient.

In an embodiment, at least one reference variable is detected in a reference variable detection step that chronologically precedes the measurement step. A reference variable in this context means a variable that represents a reference value with regard to the characteristic monitoring variables. For example, in the operation of the magnetic resonance system an effective voltage decrease and/or an effective transmission power can be detected by means of the reference variable together with the characteristic monitoring variables based on an examination subject arranged within the radio-frequency antenna, and therefore effective protection for a current magnetic resonance measurement can be achieved. The reference variable can be determined without a load being present, such that a power drop and/or a reference power within the module (in particular the empty radio-frequency antenna) can be determined, for example.

If the reference variable is detected once for a calibration and/or a first startup of the module (in particular the radio-frequency antenna), a particularly fast detection and/or determination of a maximum limit value for a magnetic resonance measurement can be achieved. The reference variable measured once is advantageously stored within a memory unit after its detection. The detection of the reference variable can be controlled by a control unit of the magnetic resonance system. The control unit can include the memory unit.

In another embodiment of the invention, in the calculation step the measured characteristic monitoring variables are transformed in at least one module that is inaccessible to a measurement. The modules that are inaccessible to the measurement are advantageously formed by modules relevant to the monitoring. A particularly exact maximum limit value for the module or the radio-frequency antenna can be determined by nearly all known transformation values and/or adaptation values being incorporated into the calculation of the power variable. In particular, in the calculation step accounts for changes to the signals that enter into the transformation of the characteristic monitoring variables, which changes can occur along a signal path from the measurement point up to the module that is relevant to the monitoring, in particular due to additional interposed modules. For example, the measured characteristic monitoring variables can be transformed in the calculation step with regard to a signal loss in a cable.

Furthermore, it can also be advantageous for the measured characteristic monitoring variables to be adapted with regard to a characteristic variable of an additional electronic element. The additional electronic element can be formed by a coil and/or a capacitor, for example in order to design an input impedance for the radio-frequency antenna so as to be modifiable.

In a further embodiment, in at least one calculation step a characteristic voltage variable and/or characteristic power variable within the module is determined from the characteristic monitoring variables. In particular, by means of the measured characteristic monitoring variables an elliptical voltage and/or power distribution within the radio-frequency antenna can hereby be determined in a measurement operation of the magnetic resonance system, and therefore an optimally exact characteristic voltage variable and/or characteristic power variable adapted to actual conditions can be achieved. In addition, the maximum limit value can advantageously be determined by means of the characteristic voltage variable and/or characteristic power variable and the reference power.

Furthermore, the invention includes a monitoring device for a monitoring and/or a protection of modules—in particular a radio-frequency antenna of a magnetic resonance system—with at least one measurement unit that is provided to measure a first characteristic monitoring variable, and a control unit that is provided to determine a maximum limit value for a power and/or a voltage by means of the measured first characteristic monitoring variable and to control a monitoring method.

The at least one measurement unit is provided to measure at least one second characteristic monitoring variable that is different than the first characteristic monitoring variable.

The invention also includes a magnetic resonance system with a radio-frequency antenna and a monitoring device as described above to monitor and/or protect the radio-frequency antenna.

DESCRIPTION OF THE PREFERRED EMBODIMENTS

Figure 1:
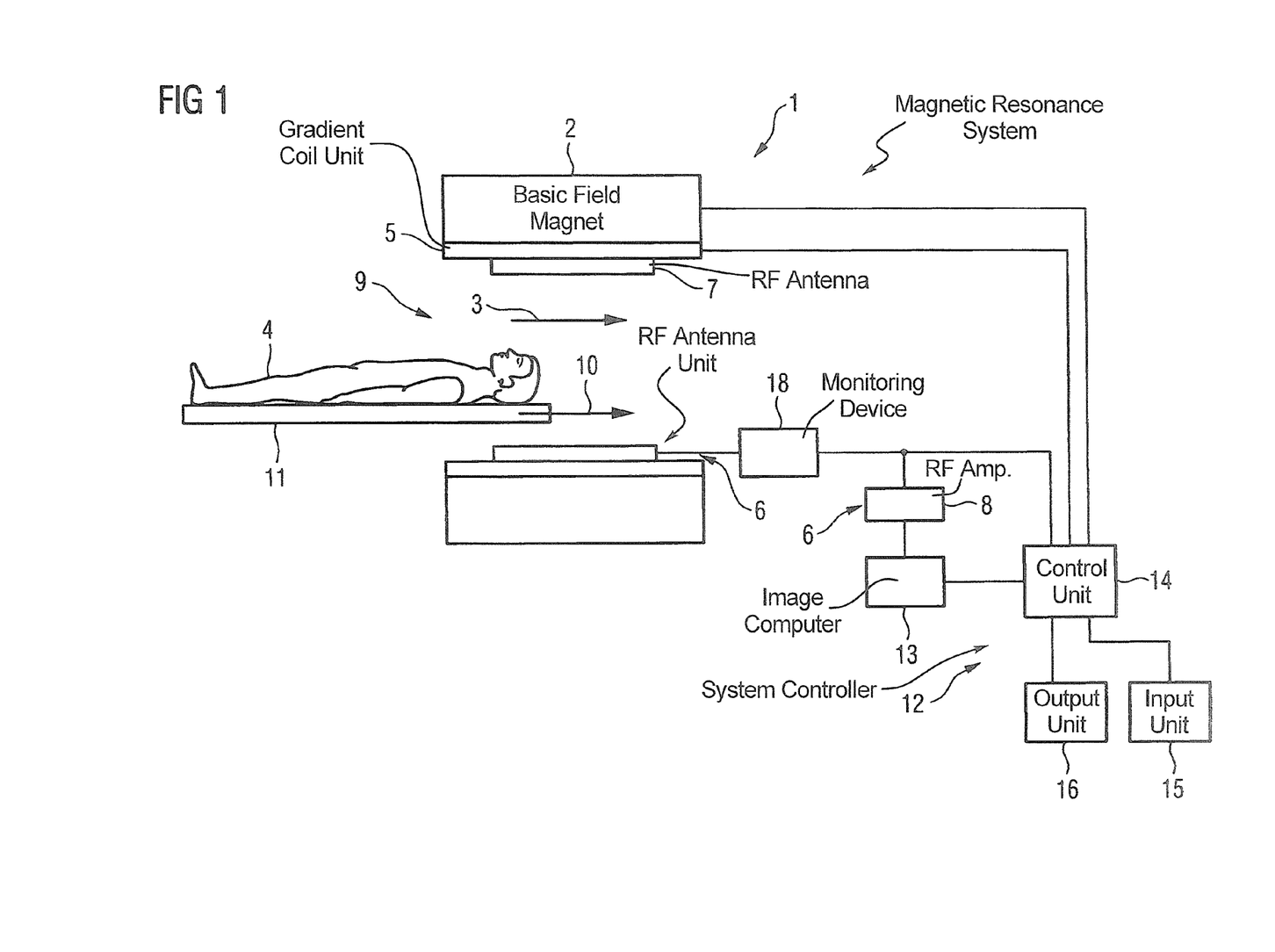
FIG. 1 shows a magnetic resonance system in a schematic representation.

A magnetic resonance system 1 according to the invention is shown in FIG. 1. The magnetic resonance system 1 has a basic field magnet 2 that, in the operation of the magnetic resonance system 1, generates a constant, strong basic magnetic field 3 for polarization of protons in an examination subject (in particular a patient 4). In addition to the basic magnet 2, the magnetic resonance system 1 has a gradient coil unit 5 that generates a linear gradient field, and a radio-frequency (RF) antenna unit 6 that radiates RF energy to deflect the magnetization of the nuclear spins and to detect a resulting resonance signal. Radio-frequency pulses are generated and emitted by means of the radio-frequency antenna unit 6.

The radio-frequency antenna unit 6 includes a radio-frequency antenna 7 to emit radio-frequency pulses and receive the magnetic resonance signals. The radio-frequency antenna unit 6 additionally has a radio-frequency amplifier 8 by means of which the received magnetic resonance signal is amplified before further processing.

The magnetic resonance system 1 has an acquisition region 9 to acquire the examination subject and/or the patient 4 for an imaging examination. The acquisition region 9 is cylindrically surrounded by the radio-frequency antenna 7, the gradient coil unit 5 and the basic magnet 2 along a z-direction 10. The examination subject can be introduced into the acquisition region 9 by means of a transport bed that can be moved along at least the z-direction 10.

The magnetic resonance system 1 additionally has a system controller 12 that includes an image computer 13 and a control unit 14. The system controller 12 can additionally include further modules and units (not shown in detail) as appear reasonable to those skilled in the art, for example an analog/digital converter, etc. An evaluation of the signals received by the radio-frequency antenna 7 takes place in the image computer 13. Magnetic resonance images are reconstructed from these signals.

Control and/or monitoring of the basic magnet 2, the gradient coil unit 5, the radio-frequency antenna unit 6 and the image computer 13 takes place by means of the control unit 14. The system controller 12 has an input unit 15 by means of which individual parameters can be entered by an operator, for example. For example, the input unit 15 can be formed by a keyboard and/or additional input units 15 known to those skilled in the art. Furthermore, the system controller 12 has an output unit 16 that, for example, is formed by a screen and/or a monitor. For example, operating information can be communicated to the operator and/or individual reconstructed magnetic resonance images can be presented to the operator by means of the output unit 16.

The magnetic resonance system 1 schematically shown in FIG. 1 can naturally include additional components that magnetic resonance systems 1 conventionally have. The general functionality of a magnetic resonance system 1 is known to those skilled in the art, such that a more detailed description of the general components is not necessary herein.

Figure 2:
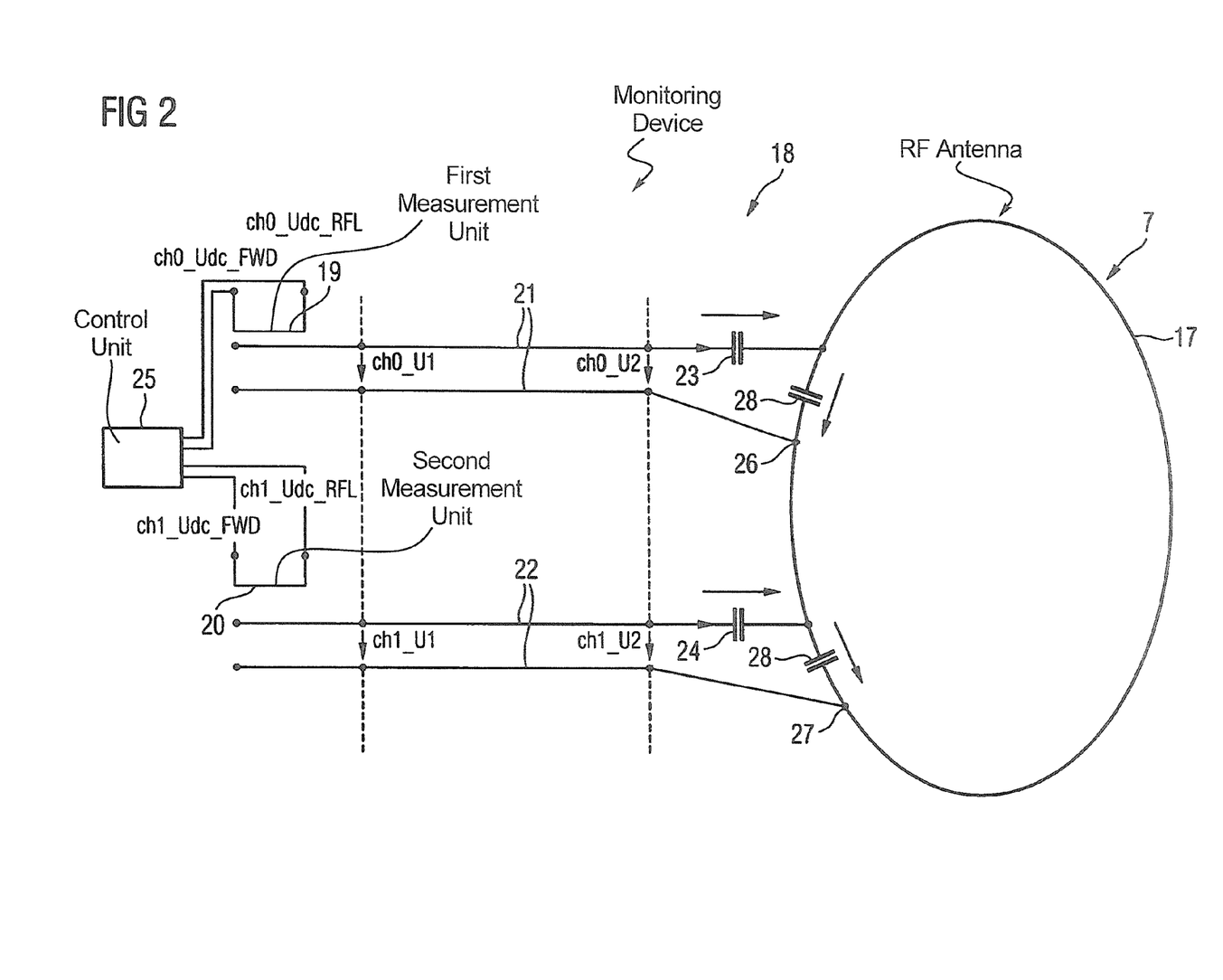
FIG. 2 shows a monitoring device of the magnetic resonance system in a schematic representation.

In the operation of the magnetic resonance system 1 it is necessary to protect individual modules (the radio-frequency antenna 7, for example) from an overload. For this purpose the magnetic resonance system 1 has a monitoring device 18 that is formed to monitor and protect a module (which here is formed by the radio-frequency antenna 7 as an example) in the operation of the magnetic resonance system 1 (FIGS. 1 and 2). The monitoring device 18 is designed to determine a maximum limit value for a power (in particular maximum allowable average power P_average_max) and/or a voltage (in particular a maximum allowable peak end voltage U_TRA_max_BC, UTra_max_Cable) for a respective measurement operation and to monitor its compliance. In particular, capacitors 28 that are arranged within the radio-frequency antenna 7 are thereby protected against an overload and/or a destruction.

For this purpose the monitoring device 18 has first and second measurement units 19, 20 that each have a directional coupler at which a characteristic monitoring variable is detected. The magnetic resonance system 1 has two voltage feed lines 21, 22 to supply a voltage to a radio-frequency antenna 7, wherein the two measurement units 19, 20 are respectively arranged in the path of one of the two voltage feeds 21, 22. The two voltage feed lines 21, 22 are respectively formed by a coaxial cable.

A first characteristic monitoring variable ch0_Udc_FWD, ch1_Udc_FWD and a second characteristic monitoring variable ch0_Udc_RFL, ch1_Udc_RFL different from the first characteristic monitoring variable ch0_Udc_FWD, ch1_Udc_FWD are respectively detected by means of the two measurement units 19, 20. Due to the arrangement of the first measurement unit 19 within the first voltage feed 21 and the second measurement unit 20 within the second voltage feed 22, the two first characteristic monitoring variables ch0_Udc_FWD, ch1_Udc_FWD and the two second characteristic monitoring variables ch0_Udc_RFL, ch1_Udc_RFL can be measured at two different measurement locations. The first characteristic monitoring variables ch0_Udc_FWD, ch1_Udc_FWD are formed by a voltage supplied to the radio-frequency antenna 7 and the second characteristic monitoring variables ch0_Udc_RFL, ch1_Udc_RFL are formed by a voltage traveling back and/or reflected back to the radio-frequency antenna 7. As an alternative, the first and/or second characteristic monitoring variables ch0_Udc_FWD, ch1_Udc_FWD ch0_Udc_RFL, ch1_Udc_RFL can also be formed by a characteristic variable of a current strength and/or additional characteristic variables appearing to be reasonable to those skilled in the art. Ch0 stands for the first voltage feed line 21 (channel 0) and ch1 stands for the second voltage feed line 22 (channel 1).

In a measurement operation the two characteristic monitoring variables ch0_Udc_FWD, ch1_Udc_FWD ch0_Udc_RFL, ch1_Udc_RFL to be measured can be measured as complex values by means of the two measurement units 19, 20 fashioned as directional couplers. For example, an amplitude and a phase difference between the two characteristic monitoring variables ch0_Udc_FWD, ch1_Udc_FWD ch0_Udc_RFL, ch1_Udc_RFL is respectively detected at the two measurement units 19, 20. The phase difference is calculated from a phase of the signal tracking to the radio-frequency antenna 7 and a phase of the signal traveling back from the radio-frequency antenna 7.

Capacitors 23, 24 are respectively arranged after both measurement units 19, 20 (fashioned as direction couplers) along a feed direction of the voltage to the radio-frequency antenna. For example, an input impedance for the radio-frequency antenna 7 can be modified by means of the two capacitors 23, 24. Furthermore, the monitoring device 18 has a control unit 25 that, in the operation of the magnetic resonance system 1, is provided to determine the maximum limit value by means of the measured characteristic monitoring variable ch0_Udc_FWD, ch1_Udc_FWD ch0_Udc_RFL, ch1_Udc_RFL and to control a monitoring method.

Figure 3:
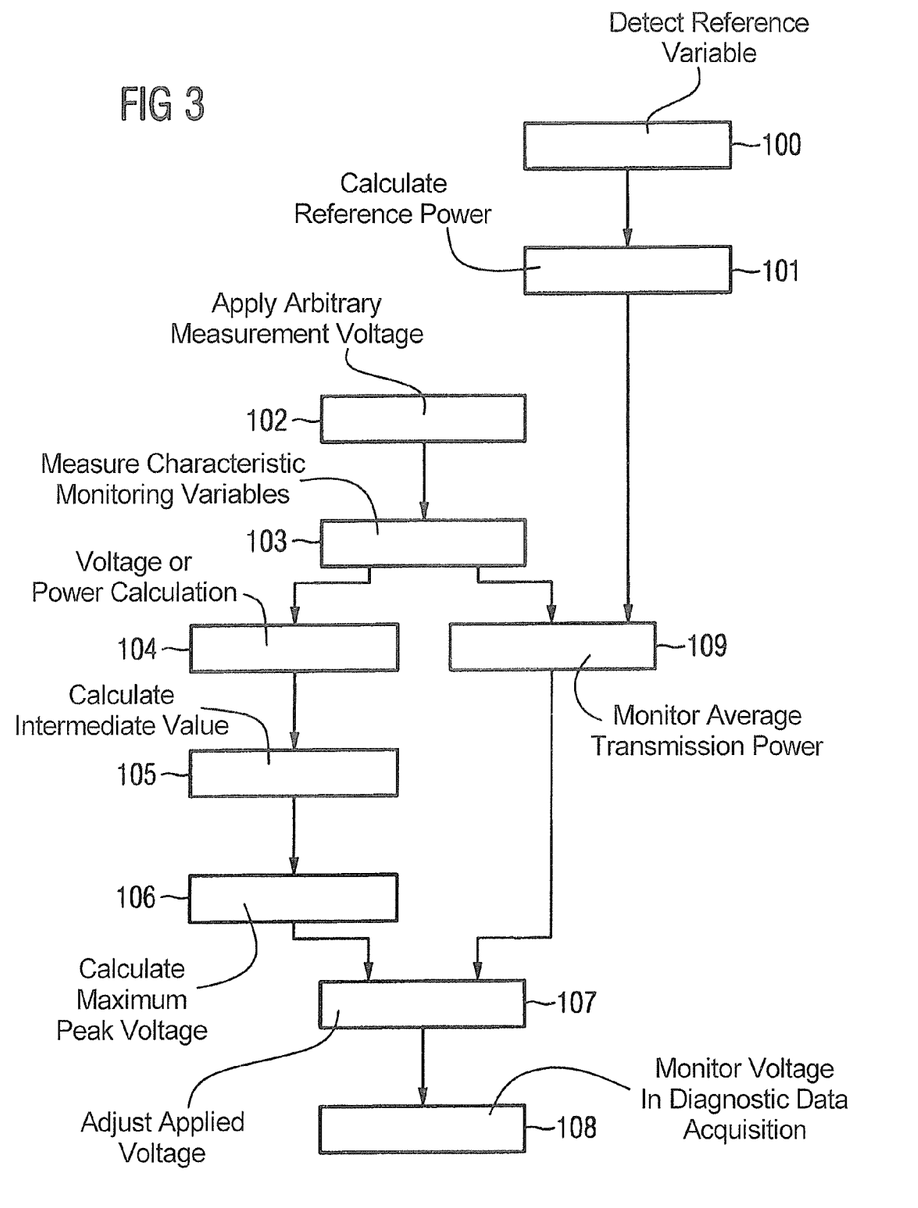
FIG. 3 shows a monitoring method according to the invention.

The monitoring method according to the invention is schematically shown in FIG. 3. A detection and/or determination of a reference variable ch0_Udc_FWD, ch1_Udc_FWD ch0_Udc_RFL, ch1_Udc_RFL initially takes place once before a measurement step 103 of the monitoring method to measure a characteristic monitoring value ch0_Uref_FWD, ch1_Uref_FWD, ch0_Uref_RFL, ch1_Uref_RFL. Multiple reference variables ch0_Uref_FWD, ch1_Uref_FWD, ch0_Uref_RFL, ch1_Uref_RFL are detected once in a first startup of the magnetic resonance system and/or given a calibration of the magnetic resonance system 1 in a reference variable detection step 100. A voltage ch0_Uref_FWD, ch1_Uref_FWD traveling toward the radio-frequency antenna 7 and a voltage ch0_Uref_RFL, ch1_Uref_RFL traveling back from the radio-frequency antenna 7 are respectively detected at each of the two measurement units 19, 20. The reference variable detection step 100 takes place at an empty radio-frequency antenna 7 in order to singly detect characteristic variables and/or properties of the radio-frequency antenna 7. The detected reference variables ch0_Uref_FWD, ch1_Uref_FWD, ch0_Uref_RFL, ch1_Uref_RFL are subsequently stored by the control unit 25, wherein for this the control unit 25 has a memory unit (not shown in detail).

Using the measured reference variables ch0_Uref_FWD, ch1_Uref_FWD, ch0_Uref_RFL, ch1_Uref_RFL, in a calculation step 101 following the reference variable detection step 100 the total absorbed reference power CPL_REF within the radio-frequency antenna 7 is determined. The measured reference variables ch0_Uref_FWD, ch1_Uref_FWD, ch0_Uref_RFL, ch1_Uref_RFL are transformed at a module 17 (formed by the radio-frequency antenna 7) that is inaccessible to a measurement.

$$P\_FWD = \frac{|ch0\_Uref\_FWD|^2 + |ch1\_Uref\_FWD|^2}{50}$$

-continued $$P\_RFL = \frac{|ch0\_Uref\_RFL|^2 + |ch1\_Uref\_RFL|^2}{50}$$

$$CPL\_REF = abs\_BC = P\_FWD \cdot |\kappa 1|^2 - \frac{P\_RFL}{|\kappa 1|^2}$$

An electrical resistance of 50Ω that is present within the monitoring device 18 enters into the total absorbed reference power CPL_REF. κ1 is a transformation value in order to account for a signal loss (which a signal induces on a path from one of the measurement units 19, 20 to the radio-frequency antenna 7 via one of the voltage feed lines 21, 22) in the calculation.

In addition to this, a reference voltage ch0_U2_REF, ch1_U2_REF can be calculated for each voltage feed line 21, 22:

$$ch0\_U2\_REF = ch0\_Uref\_FWD \cdot \kappa 1(1 + i\kappa 2) + \frac{ch0\_Uref\_RFL}{\kappa 1}(1 - i\kappa 2)$$

$$ch1\_U2\_REF = ch1\_Uref\_FWD \cdot \kappa 1(1 + i\kappa 2) + \frac{ch1\_Uref\_RFL}{\kappa 1}(1 - i\kappa 2)$$

By means of the factor κ2 the reference variables ch0_Uref_FWD, ch1_Uref_FWD, ch0_Uref_RFL, ch1_Uref_RFL are adapted to additional electronic elements that, in the further course of the voltage feed lines 21, 22, are arranged between the measurement units 19, 20 and the radio-frequency antenna 7. The additional electronic elements are presently formed by the two capacitors 23, 24, such that in particular capacitance of the two capacitors 23, 24 is accounted for in the calculation step 102 by the factor κ2.

In one measurement operation the maximum limit value for a power and/or a voltage is determined before a beginning of an imaging magnetic resonance measurement. An application 102 of an arbitrary measurement voltage U_x at the radio-frequency antenna 7 hereby initially takes place. The measurement voltage U_x is advantageously formed by a low voltage. A measurement and/or detection of the individual characteristic monitoring variables ch0_Udc_FWD, ch1_Udc_FWD, ch0_Udc_RFL, ch1_Udc_RFL subsequently takes place first in a measurement step 103 by means of the two measurement units 19, 20. The measurement step 103 takes place at the patient 4 at whom a subsequent magnetic resonance measurement should be conducted.

Using these measured characteristic monitoring variables ch0_Udc_FWD, ch1_Udc_FWD, ch0_Udc_RFL, ch1_Udc_RFL, in a first calculation step 104 voltage variables ch0_U1, ch1_U1 that are formed from a total voltage and occur at the measurement units 19, 20 are subsequently calculated by the control unit 25. The following voltage variables ch0_U1, ch1_U1 result for the first and second voltage feed lines 21, 22:

$$ch0\_U1 = ch0\_Udc\_FWD + ch0\_Udc\_RFL$$

$$ch1\_U1 = ch1\_Udc\_FWD + ch1\_Udc\_RFL$$

Under consideration of a signal loss in the coaxial cables and the capacitors 23, 24, in the calculation step 104 a voltage ch0_U2, ch1_U2 is determined that is present at infeed points 26, 26 of the radio-frequency antenna 7. If the monitored module such as the RF antenna 7 is inaccessible to direct measurement, measured characteristic monitoring variables ch0_Udc_FWD, ch1_Udc_FWD, ch0_Udc_RFL, ch1_Udc_RFL are transformed:

$$ch0\_U2 = ch0\_Udc\_FWD \cdot \kappa 1(1 + i\kappa 2) + \frac{ch0\_Udc\_RFL}{\kappa 1}(1 - i\kappa 2)$$

$$ch1\_U2 = ch1\_Udc\_FWD \cdot \kappa 1(1 + i\kappa 2) + \frac{ch1\_Udc\_RFL}{\kappa 1}(1 - i\kappa 2)$$

In a second calculation step 105 the intermediate value M is calculated from this:

$$M = \frac{1}{2}\sqrt{\begin{array}{c}|ch0\_U2|^4 + |ch1\_U2|^4 + 2|ch0\_U2|^2|ch1\_U2|^2 \cdot \\ \cos(2(ch1\_U2 - ch0\_U2))\end{array}}$$

By means of the intermediate value M, a characteristic voltage variable present at the individual capacitors 23, 24 is subsequently calculated in the form of a maximum voltage U2 by the control unit 25 in the second calculation step 105. U2_max reflects a value for a semimajor axis of an elliptical voltage distribution within the radio-frequency antenna 7.

$$U2\_max = \sqrt{\frac{|ch0\_U2|^2 + |ch1\_U2|^2}{2} + M}$$

The elliptical voltage distribution thereby more closely approximates an actual voltage distribution within the radio-frequency antenna 7 in a measurement operation with a patient 4 than a circular voltage distribution within the radio-frequency antenna 7. A first maximum limit value in the form of a maximum allowable peak transmission voltage U_TRA_max_BC present at the radio-frequency antenna is determined from U2_max together with the measurement voltage U_x present at the radio-frequency antenna 7

$$U\_Tra\_max\_BC = \frac{MaxVoltageCoil}{U2\_max} U\_x$$

MaxVoltageCoil is hereby a predetermined, design-dependent, maximum allowable peak voltage for the radio-frequency antenna 7 that is formed by a constant value.

In a third calculation step 106 a characteristic voltage variable in the form of a maximum peak voltage ch0_UCable, ch1_UCable in the two voltage feed lines 21, 22 (formed by coaxial cables) is additionally calculated by the control unit 25:

$$ch0\_UCable = |ch0\_Udc\_FWD \cdot \kappa 1| + \left|\frac{ch0\_Udc\_RFL}{\kappa 1}\right|$$

$$ch1\_UCable = |ch1\_Udc\_FWD \cdot \kappa 1| + \left|\frac{ch1\_Udc\_RFL}{\kappa 1}\right|$$

A second maximum limit value results from this in the form of a maximum allowable peak transmission voltage UTra_max_Cable within the two voltage feed lines 21, 22:

$$UTra\_max\_Cable = \frac{MaxVoltageCable}{Max[ch0\_UCable, ch1\_UCable]} U\_REF$$

MaxVoltageCable is a predetermined, design-dependent, maximum allowable peak voltage for the voltage feed lines 21, 22 that is formed by a constant value. The smaller maximum allowed transmission voltage (thus ch0_UCable or ch1_UCable) hereby enters into the calculation of the maximum peak transmission voltage UTra_max_Cable with Max [ch0_UCable, ch1_UCable].

After the determination and/or calculation of the maximum peak transmission voltage U_TRA_max_BC, UTra_max_Cable both in the two voltage feed lines 21, 22 and within the radio-frequency antenna 7, following this a maximum upper limit for an applied voltage or voltage to be applied in a measurement operation is set by the control unit 25 in an adjustment step 107. Insofar as the calculated maximum peak transmission voltages U_TRA_max_BC, UTra_max_Cable are greater than the design-dependent peak voltages MaxVoltageCoil, MaxVoltageCable, the design-dependent peak voltages MaxVoltageCoil, MaxVoltageCable are set as a maximum upper limit for the applied voltage or voltage to be applied. In a monitoring step 108 the current transmission voltage is subsequently monitored for the subsequent magnetic resonance measurement (diagnostic data acquisition), such that this current transmission voltage does not exceed the maximum upper limit for the peak transmission voltages.

In addition to a calculation and a monitoring of the peak transmission voltages U_TRA_max_BC, UTra_max_Cable, in an additional calculation step 109 a monitoring of a maximum average transmission power P_average_max also takes place in an additional calculation step 109. The additional calculation step 109 can run simultaneously with the calculation steps 104, 105, 106.

In this calculation step 109 the power P_FWD supplied to the radio-frequency antenna 7 and the power P_RFL returned from the radio-frequency antenna 7 are initially determined by the control unit 25. This calculation takes place without a consideration of signal losses within the two voltage feed lines 21, 2.

$$P\_FWD = \frac{|ch0\_Udc\_FWD|^2 + |ch1\_Udc\_FWD|^2}{50}$$

$$P\_RFL = \frac{|ch0\_Udc\_RFL|^2 + |ch1\_Udc\_RFL|^2}{50}$$

The transmission voltage U_Tra applied in the radio-frequency antenna 7 is thus:

$$U\_Tra = \sqrt{P\_FWD \cdot 50}$$

The total power P_abs_BC absorbed by the radio-frequency antenna 7 together with that absorbed by the examination subject is accordingly determined as:

$$P\_abs\_BC = P\_FWD \cdot |\kappa 1|^2 - \frac{P\_RFL}{|\kappa 1|^2}$$

In the calculation step 109 the voltage ch0_U2, ch1_U2 fed to the radio-frequency antenna 7 is determined as follows, under consideration of a signal loss in the coaxial cables and the capacitors 23, 24:

$$ch0\_U2 = ch0\_Udc\_FWD \cdot \kappa 1(1 + i\kappa 2) + \frac{ch0\_Udc\_RFL}{\kappa 1}(1 - i\kappa 2)$$

-continued $$ch1\_U2 = ch1\_Udc\_FWD \cdot \kappa1(1 + i\kappa2) + \frac{ch1\_Udc\_RFL}{\kappa1}(1 - i\kappa2)$$

A calculation of a characteristic power variable in the form of a power loss CPL within the radio-frequency antenna 7 subsequently takes place in the calculation step 109. Both the reference value for the total absorbed reference power CPL_REF within the radio-frequency antenna 7 and the reference voltages ch0_U2_REF, ch1_U2_REF in the individual voltage feed lines of the reference measurement are hereby taken into account.

$$CPL = CPL\_REF \frac{|ch0\_U2|^2 + |ch1\_U2|^2}{|ch0\_U2\_REF|^2 + |ch1\_U2\_REF|^2}$$

A relationship between the power loss CPL within the radio-frequency antenna 7 and the power P_FWD fed into the radio-frequency antenna 7 can be calculated from this by the control unit 25 in the calculation step 109.

$$\text{Efficiency} = \frac{CPL}{P\_FWD}$$

The allowed, maximum average transmission power P_average_max in a measurement operation thus results as:

$$P\_average\_max = \frac{BCAvPwLimit\_LT}{\text{Efficiency}}$$

BCAvPwLimit_LT is hereby the a [sic] predetermined, design-dependent maximum average transmission port for the radio-frequency antenna 7 that is formed by a constant value.

The allowed, maximum average transmission power P_average_max hereby forms a third maximum limit value. A measurement time can also additionally be taken into account in the determination and/or the calculation of the maximum average transmission power P_average_max. The longer the measurement time, the lower the maximum average transmission power P_average_max in order to achieve an effective component protection during the measurement operation.

After the determination and/or calculation of maximum average transmission power P_average_max of the radio-frequency antenna 7, in a subsequent adjustment step 107 a maximum upper limit for an average transmission power in a measurement operation of the radio-frequency antenna 7 is set by the control unit 25. Insofar as the calculated maximum average transmission power P_average_max is smaller than the design-dependent maximum average transmission power BCAvPwLimit_LT, the calculated maximum average transmission power P_average_max is set as a maximum upper limit for the average transmission power. Insofar as the calculated maximum average transmission power P_average_max is greater than the design-dependent, maximum average transmission power BCAvPwLimit_LT, the design-dependent, maximum average transmission power BCAvPwLimit_LT is set as a maximum upper limit for the average transmission power. In the monitoring step 108 the average transmission power is subsequently monitored for the following magnetic resonance measurement, such that this average transmission power does not exceed the maximum upper limit for said average transmission power.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for monitoring a radio-frequency (RF) antenna of a magnetic resonance apparatus, comprising the steps of:
    operating a magnetic resonance apparatus having an RF antenna, by supplying voltage to said RF antenna via a first feed line comprising a first capacitor at an infeed point of said first feed line to said RF antenna, and via a second feed line comprising a second capacitor at an infeed point of said second feed line to said RF antenna, aid voltage said RF antenna to operate with an elliptical voltage distribution that causes said RF antenna to emit said RF energy at a transmission power;
    during said operation of said RF antenna in said magnetic resonance system, measuring a first characteristic monitoring variable, in one of said feed lines, associated with said operation of said RF antenna, said first characteristic monitoring variable being selected from the group consisting of power amperage and voltage;
    also during said operation of said RF antenna, measuring a second characteristic monitoring variable, in another of said feed lines, associated with said operation of said RF antenna, that is different from said first characteristic monitoring variable; and
    supplying said first and second characteristic monitoring variables to a computerized processor and, in said computerized processor, automatically calculating, in a first calculation step, a maximum limit value for voltages at said first capacitor and said second capacitor at said respective infeed points of said RF antenna, from said first and second characteristic monitoring variables and, in a second calculation step, a maximum limit value of said elliptical voltage distribution within the RF antenna as a value of a semimajor axis of said elliptical voltage distribution within said RF antenna produced by said respective voltages at said first and second capacitors; and
    making said maximum limit value of said elliptical voltage distribution, as said value of said semimajor axis of said elliptical voltage distribution, available in electronic form at an output of said computerized processor.

2. A method as claimed in claim 1 comprising measuring said first characteristic monitoring variable at a signal proceeding into said RF antenna, and measuring said second characteristic monitoring variable at a signal proceeding from said RF antenna.

3. A method as claimed in claim 1 comprising measuring the first characteristic monitoring variable and the second characteristic monitoring variable respectively at two different measurement locations.

4. A method as claimed in claim 1 comprising measuring said first and second characteristic monitoring variables before operating said magnetic resonance apparatus in a magnetic resonance diagnostic data acquisition procedure with an examination subject in said magnetic resonance apparatus.

5. A method as claimed in claim 1 comprising measuring said first and second characteristic monitoring variables with an arbitrary voltage applied to said RF antenna.

6. A method as claimed in claim 1 wherein said RF antenna is inaccessible to a direct measurement of said voltage at said infeed points and said maximum limit value, and comprising mathematically transforming said first and second measured characteristic monitoring variables to apply to said inaccessible module.

7. A method as claimed in claim 6 comprising transforming said first and second measured characteristic monitoring variables dependent on a signal loss in a voltage feed line to said inaccessible RF antenna.

8. A method as claimed in claim 6 comprising transforming said first and second measured characteristic monitoring variables dependent on a measured characteristic variable of a circuit element that interacts with said RF antenna during said operation of said RF antenna.

9. A method as claimed in claim 1 comprising measuring at least one reference variable before measuring said first and second characteristic monitoring variables.

10. A method as claimed in claim 9 comprising measuring said reference variable in a calibration procedure for said magnetic resonance apparatus or upon a first start-up of said operation of said RF antenna.

11. A method as claimed in claim 9 comprising determining said reference variable without a load being present with respect to said RF antenna.

12. A method as claimed in claim 9 comprising, in said computerized processor, determining a reference power within said RF antenna using said reference variable.

13. A method as claimed in claim 1 comprising detecting a reference power before measuring said first and second characteristic monitoring variables and, in said processor, calculating said maximum limit value from said reference power and at least one of said characteristic voltage and characteristic power.

14. A method as claimed in claim 1 comprising calculating said maximum limit value of said voltage distribution as a maximum peak transmission voltage.

15. A method as claimed in claim 1 comprising calculating said maximum limit value of said voltage distribution as a maximum average transmission power.

16. A device for monitoring a radio-frequency (RF) antenna of a magnetic resonance apparatus, said magnetic resonance apparatus comprising an RF antenna that is operated to emit RF energy by supplying voltage to said RF antenna via a first feed line comprising a first capacitor at an infeed point of said first feed line to said RF antenna, and via a second feed line comprising a second capacitor at an infeed point of said second feed line to said RF antenna, aid voltage to operate with an elliptical voltage distribution that causes said RF antenna to emit said RF energy at a transmission power, comprising:
a measuring arrangement that, during said operation of said RF antenna in said magnetic resonance apparatus, measures a first characteristic monitoring variable, in one of said feed lines, associated with said operation of said RF antenna;
said measuring arrangement, also during said operation of said RF antenna, measuring a second characteristic monitoring variable, in another of said feed lines, associated with said operation of said RF antenna, that is different from said first characteristic monitoring variable;
a computerized processor supplied with said first and second characteristic monitoring variables, said computerized processor, being configured to automatically calculate, in a first calculation, a maximum limit value for at said respective infeed points of said RF antenna, from said first and second characteristic monitoring variables and to calculate, in a second calculation, a maximum limit value of said elliptical voltage distribution within said RF antenna as a value of a semimajor axis of said elliptical voltage distribution within said RF antenna produced by said respective voltages at said first and second capacitors; and
said computerized processor being configured to make said maximum limit value of said elliptical voltage distribution, as said value of said semimajor axis of said elliptical voltage distribution, available in electronic form at an output of said computerized processor.

17. A magnetic resonance system comprising:
a magnetic resonance data acquisition unit comprising a radio frequency (RF) antenna;
a control unit configured to operate said magnetic resonance data acquisition unit, by supplying voltage to said RF antenna, via a first feed line comprising a first capacitor at an infeed point of said first feed line to said RF antenna, and via a second feed line comprising a second capacitor at an infeed point of said second feed line to said RF antenna, aid voltage causing said RF antenna to operate with an elliptical voltage distribution that causes said RF antenna to emit said RF energy at a transmission power;
a monitoring device that monitors said RF antenna, said monitoring device being configured to, during operation of said RF antenna in a magnetic resonance data acquisition unit, measure a first characteristic monitoring variable, in one of said feed lines, associated with said operation of said RF antenna, and also during said operation of said RF antenna, said first characteristic monitoring variable being selected from the group consisting of power amperage and voltage, to measure a second characteristic monitoring variable associated, in another of said feed lines, with said operation of said RF antenna, that is different from said first characteristic monitoring variable; and
said monitoring device comprising a computerized processor supplied with said first and second characteristic monitoring variables, said computerized processor being configured to automatically calculate, in a first calculation, a maximum limit value for voltages at said first capacitor and said second capacitor, a voltage at said respective infeed points of said RF antenna, from said first and second characteristic monitoring variables and to calculate, in a second calculation, a maximum limit value of said elliptical voltage distribution within said RF antenna (b) as a value of a semimajor axis of said elliptical voltage distribution within said RF antenna produced by said respective voltages at said first and second capacitors; and
said computerized processor being configured to make said maximum limit value of said elliptical voltage distribution, as said value of said semimajor axis of said elliptical voltage distribution, available in electronic form at an output of said computerized processor.

* * * * *